US006936887B2

(12) United States Patent
Harari et al.

(10) Patent No.: US 6,936,887 B2
(45) Date of Patent: Aug. 30, 2005

(54) NON-VOLATILE MEMORY CELLS UTILIZING SUBSTRATE TRENCHES

(75) Inventors: Eliyahou Harari, Los Gatos, CA (US); Jack H. Yuan, Cupertino, CA (US); George Samachisa, San Jose, CA (US); Henry Chien, Manassas, VA (US)

(73) Assignee: SanDisk Corporation, Sunnyvale, CA (US)

( * ) Notice: Subject to any disclaimer, the term of this patent is extended or adjusted under 35 U.S.C. 154(b) by 565 days.

(21) Appl. No.: 09/925,134

(22) Filed: Aug. 8, 2001

(65) Prior Publication Data

US 2004/0000688 A1 Jan. 1, 2004

Related U.S. Application Data

(63) Continuation-in-part of application No. 09/860,704, filed on May 18, 2001.

(51) Int. Cl.[7] .............................................. H01L 29/788

(52) U.S. Cl. ..................... 257/319; 257/314; 257/315; 257/316; 257/324

(58) Field of Search ................................ 257/314, 315, 257/316, 317, 318, 319, 320, 321, 322, 323, 324, 325, 326, 390

(56) References Cited

U.S. PATENT DOCUMENTS

| | | |
|---|---|---|
| 4,112,507 A | 9/1978 | White et al. |
| 4,811,067 A | 3/1989 | Fitzgerald et al. |
| 4,835,741 A | 5/1989 | Baglee |
| 4,890,145 A | 12/1989 | Malhi |
| 4,975,384 A | 12/1990 | Baglee |

(Continued)

FOREIGN PATENT DOCUMENTS

| | | |
|---|---|---|
| EP | 0 601 747 A2 | 6/1994 |
| JP | 03-042873 | 2/1991 |
| JP | 10-41414 | * 2/1998 |
| JP | 10041414 | 2/1998 |
| TW | 25221 | 7/1995 |
| WO | WO 97/32309 | 9/1997 |

OTHER PUBLICATIONS

Chan et al., "A True Single–Transistor Oxide–Nitride–Oxide EEPROM Device," *IEEE Electron Device Letters*, vol. EDL–8, No. 3, Mar. 1987, pp. 93–95.

(Continued)

*Primary Examiner*—Nathan J Flynn
*Assistant Examiner*—Kevin Quinto
(74) *Attorney, Agent, or Firm*—Parsons Hsue & de Runtz LLP

(57) ABSTRACT

Several embodiments of flash EEPROM split-channel cell arrays are described that position the channels of cell select transistors along sidewalls of trenches in the substrate, thereby reducing the cell area. Select transistor gates are formed as part of the word lines and extend downward into the trenches with capacitive coupling between the trench sidewall channel portion and the select gate. In one embodiment, trenches are formed between every other floating gate along a row, the two trench sidewalls providing the select transistor channels for adjacent cells, and a common source/drain diffusion is positioned at the bottom of the trench. A third gate provides either erase or steering capabilities. In another embodiment, trenches are formed between every floating gate along a row, a source/drain diffusion extending along the bottom of the trench and upwards along one side with the opposite side of the trench being the select transistor channel for a cell. In another embodiment, select transistor gates of dual floating gate memory cells are extended into trenches or recesses in the substrate in order to lengthen the select transistor channel as the surface dimensions of the cell are being decreased. Techniques for manufacturing such flash EEPROM split-channel cell arrays are also included.

30 Claims, 11 Drawing Sheets

U.S. PATENT DOCUMENTS

| | | |
|---|---|---|
| 4,990,979 A | 2/1991 | Otto |
| 5,070,032 A | 12/1991 | Yuan et al. |
| 5,095,344 A | 3/1992 | Harari |
| 5,168,334 A | 12/1992 | Mitchell et al. |
| 5,172,338 A | 12/1992 | Mehrotra et al. |
| 5,313,421 A | 5/1994 | Guterman et al. |
| 5,315,142 A | 5/1994 | Acovic et al. |
| 5,315,541 A | 5/1994 | Harari et al. |
| 5,343,063 A | 8/1994 | Yuan et al. |
| 5,411,905 A | 5/1995 | Acovic et al. |
| 5,486,714 A | 1/1996 | Hong |
| 5,495,441 A | 2/1996 | Hong |
| 5,498,564 A | 3/1996 | Geissler et al. |
| 5,576,567 A | 11/1996 | Mori |
| 5,579,259 A | 11/1996 | Samachisa et al. |
| 5,606,521 A | 2/1997 | Kuo et al. |
| 5,616,510 A | 4/1997 | Wong |
| 5,643,814 A | 7/1997 | Chung |
| 5,661,053 A | 8/1997 | Yuan |
| 5,712,180 A | 1/1998 | Guterman et al. |
| 5,786,612 A | 7/1998 | Otani et al. |
| 5,851,881 A | 12/1998 | Lin et al. |
| 5,891,774 A | 4/1999 | Ueda et al. |
| 5,949,101 A | 9/1999 | Aritome |
| 6,011,725 A | 1/2000 | Eitan |
| 6,037,221 A | 3/2000 | Lee et al. |
| 6,103,573 A | 8/2000 | Harari et al. |
| 6,137,718 A | 10/2000 | Reisinger |
| 6,151,248 A | 11/2000 | Harari et al. |
| 6,222,762 B1 | 4/2001 | Guterman et al. |
| 6,248,633 B1 | 6/2001 | Ogura et al. |
| 6,281,075 B1 | 8/2001 | Yuan et al. |
| 6,316,315 B1 | 11/2001 | Hofmann et al. |
| 6,346,725 B1 * | 2/2002 | Ma et al. |
| 6,391,716 B1 | 5/2002 | Liou |
| 6,512,263 B1 | 1/2003 | Yuan et al. |
| 6,532,172 B2 | 3/2003 | Harari et al. |
| 2002/0118574 A1 | 8/2002 | Gongwer et al. |
| 2002/0130350 A1 | 9/2002 | Shin et al. |

OTHER PUBLICATIONS

Nozaki et al., "A 1–Mb EEPROM with MONOS Memory Cell for Semiconductor Disk Application," *IEEE Journal of Solid State Circuits*, vol. 26, No. 4, Apr. 1991, pp. 497–501.

Eitan et al., "NROM: A Novel Localized Trapping, 2–Bit Nonvolatile Memory Cell," *IEEE Electron Device Letters*, vol. 21, No. 11, Nov. 2000, pp. 543–545.

DiMaria et al., "Electrically–Alterable Read–Only–Memory Using Si–rich $SIO_2$ Injectors and a Floating Polycrystalline Silicon Storage Layer," *J. Appl. Phys.* 52(7), Jul. 1981, pp. 4825–4842.

Hori et al., "A MOSFET with Si–Implanted Gate–$SiO_2$ Insulator for NonVolatile Memory Applications," IEDM 92, Apr. 1992, pp. 469–472.

"Notification of Transmittal of the International Search Report or the Declaration", European Patent Office, International Searching Authority, Jan. 29, 2003, 7 pages.

Ogura et al. "Low Voltage, Low Current, High Speed Program step split gate Cell with Ballistic Direct Injection for EEPROM/Flash," *IEEE Publication*, Sep. 1998, pp. 36.5.1–36.5.4.

Di–Son Kuo et al., "TEFET—A High Density, Low Erase Voltage, Trench Flash EEPROM," *IEEE Publication*, Apr. 1994, pp. 51–52.

Pein et al., "Performance of the 3–D Sidewall Flash EPROM Cell," *Symposium on VLSI Technology Digest of Technical Papers (IEEE)*, Nov. 1993, pp. 2.1.1–2.1.4.

* cited by examiner

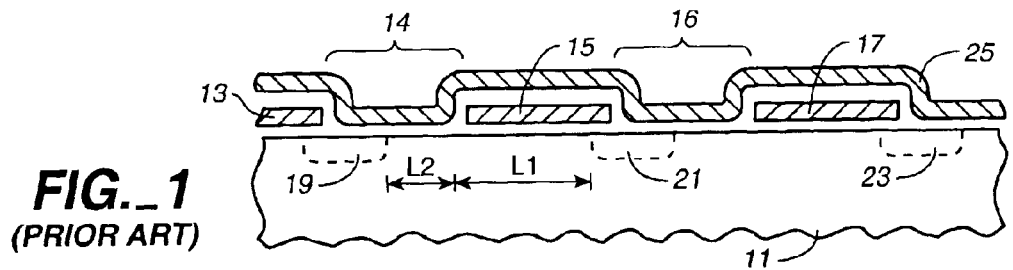
FIG._1
(PRIOR ART)
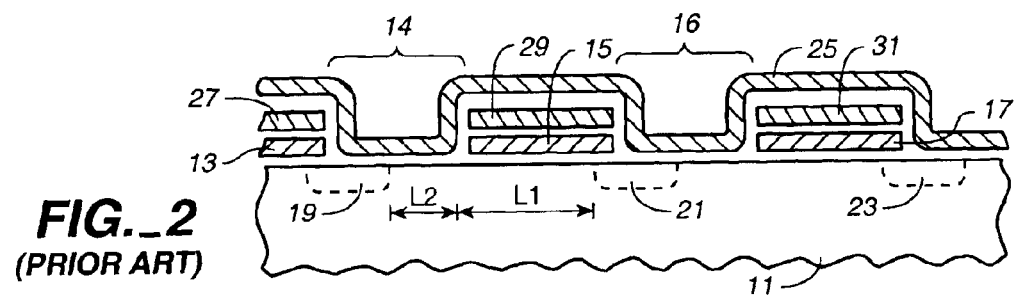
FIG._2
(PRIOR ART)
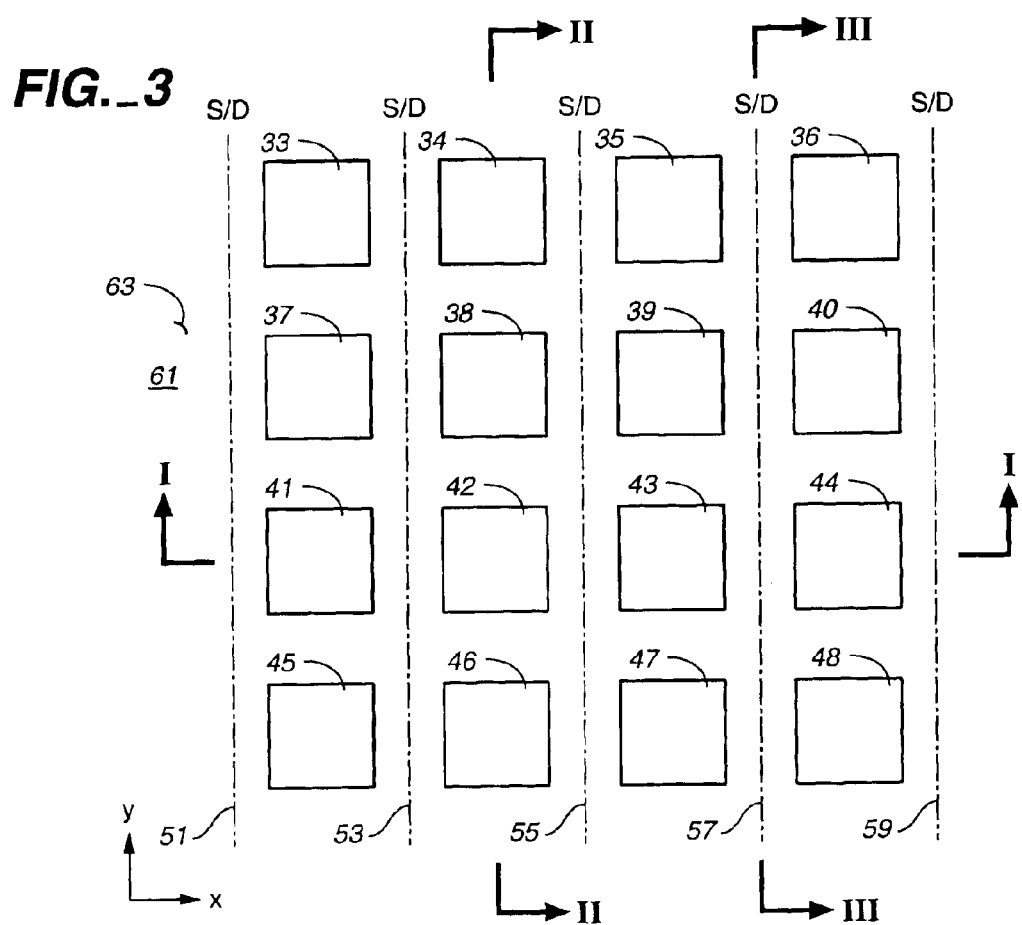
FIG._3

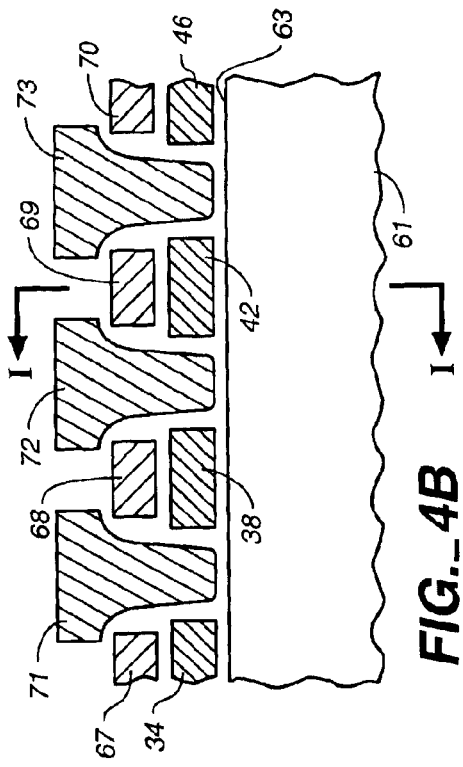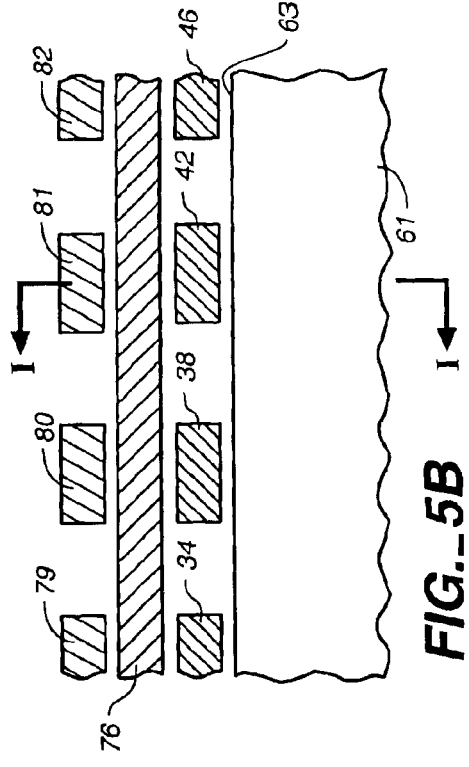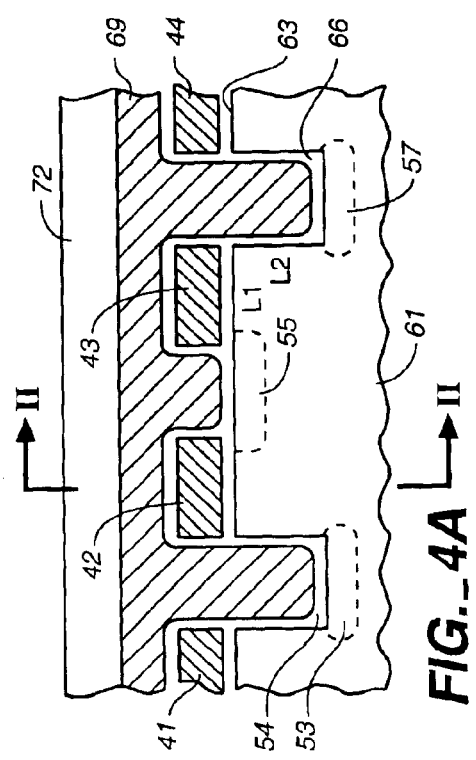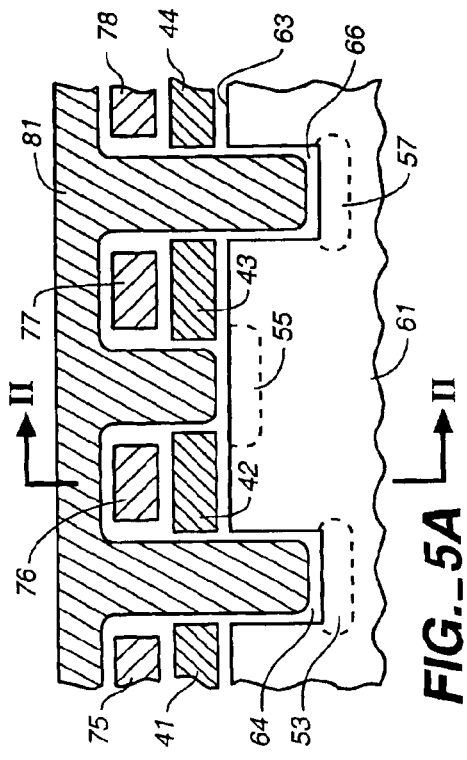

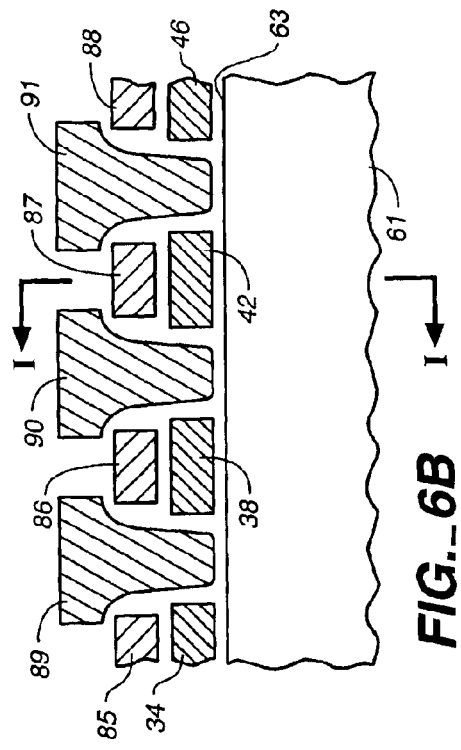
FIG._6A
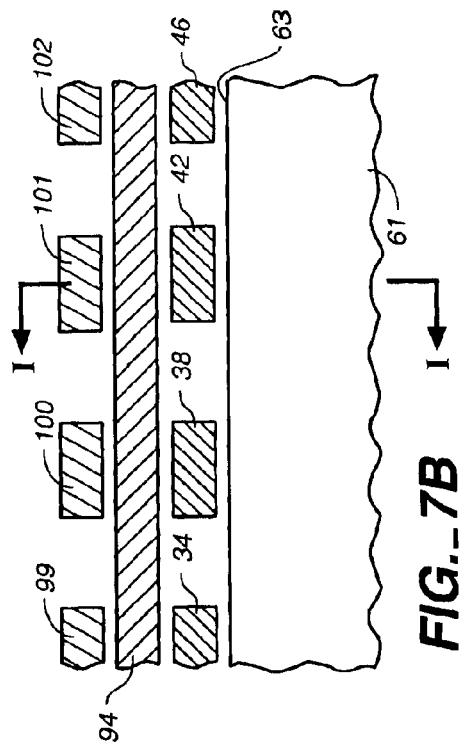
FIG._7A
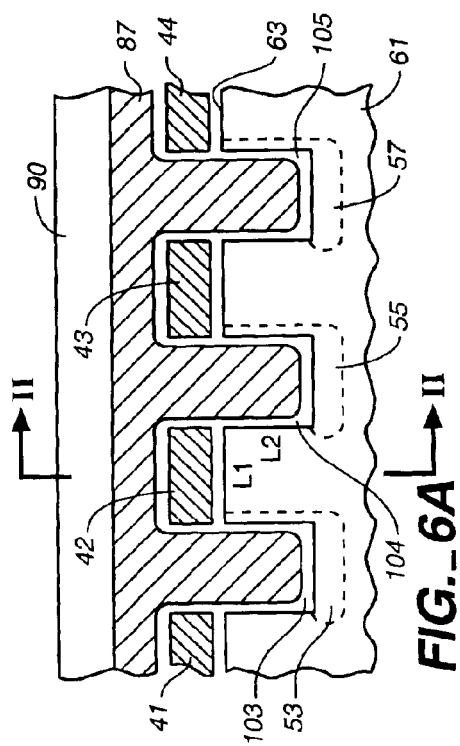
FIG._6B
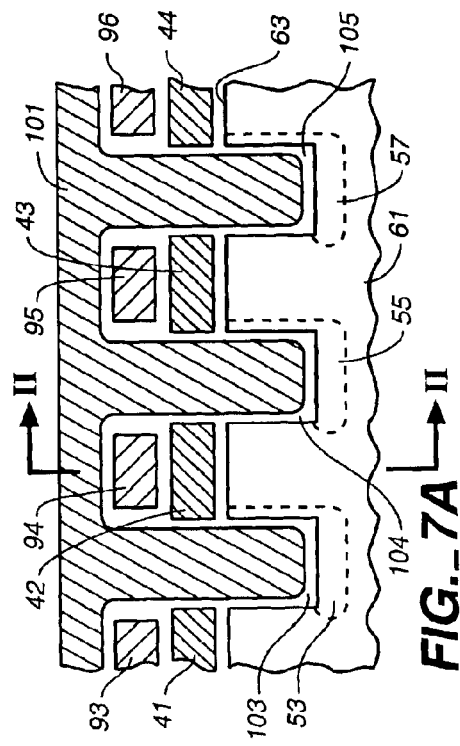
FIG._7B

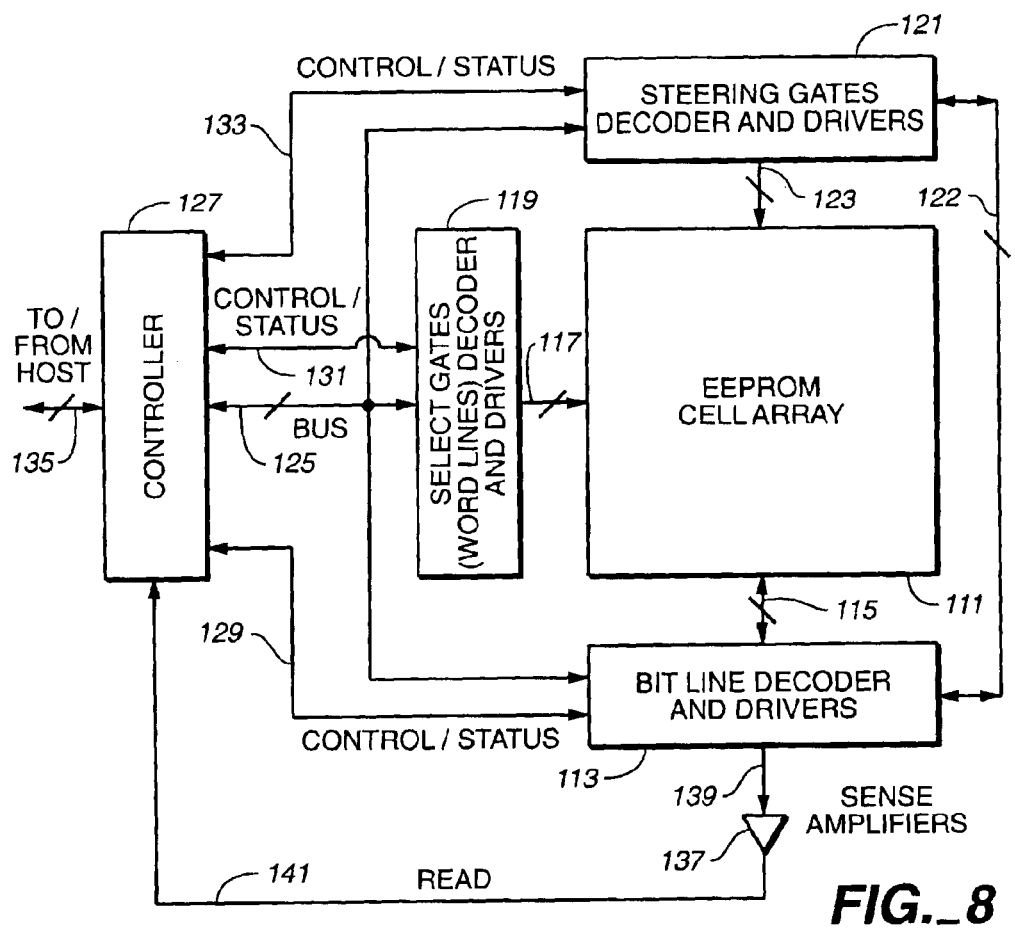
FIG._8

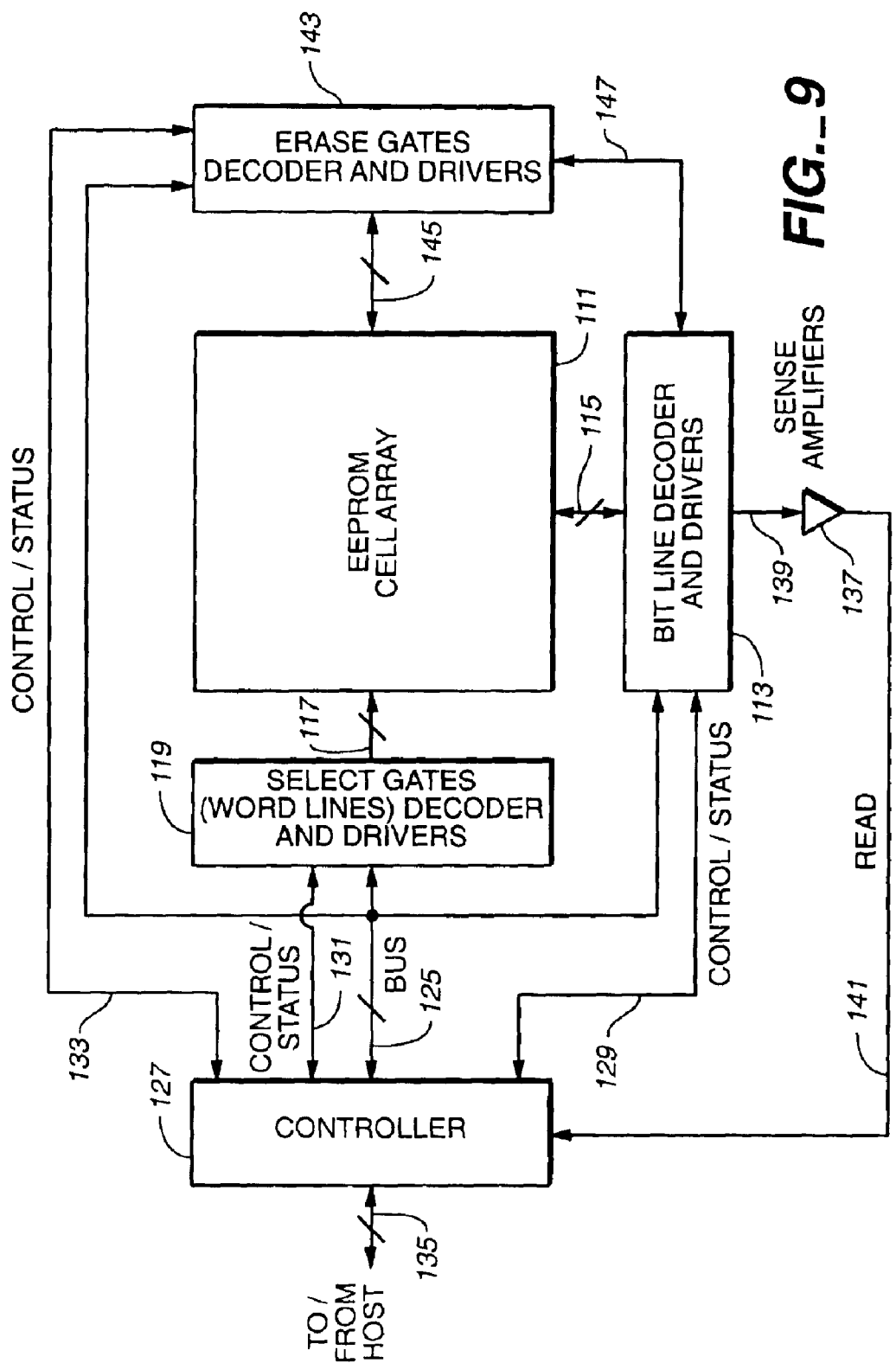
FIG._9

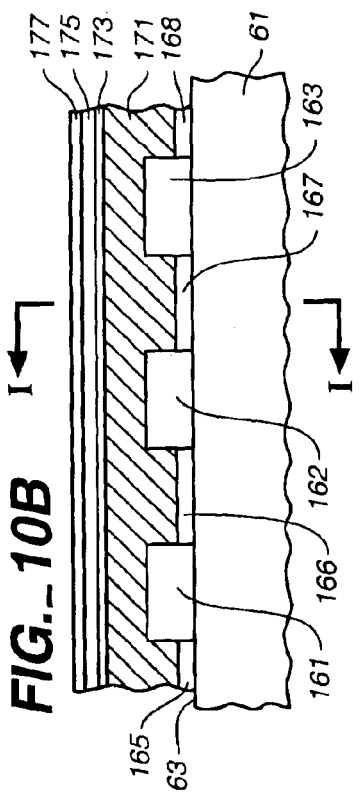
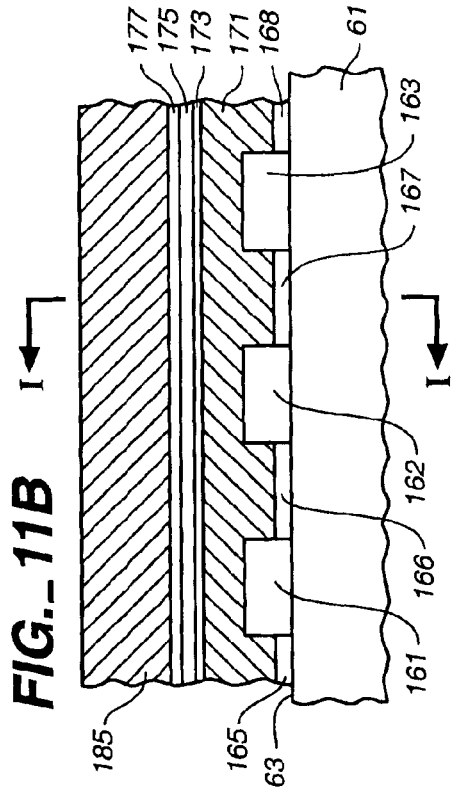
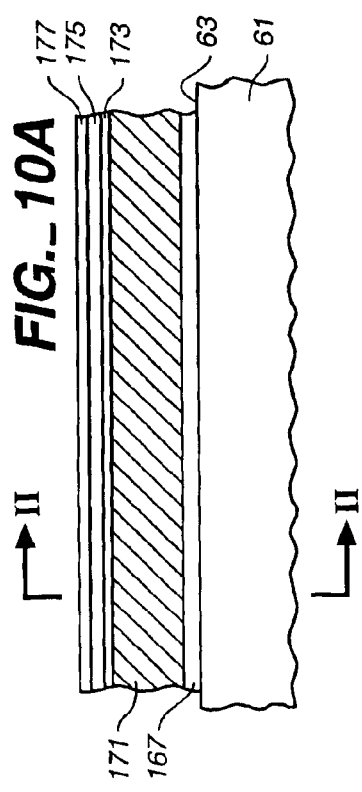
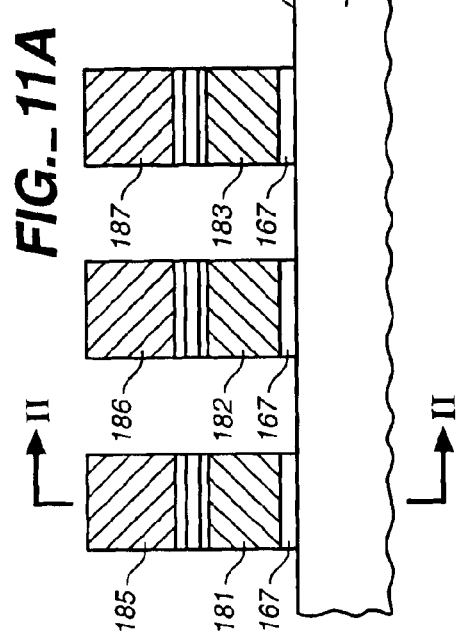

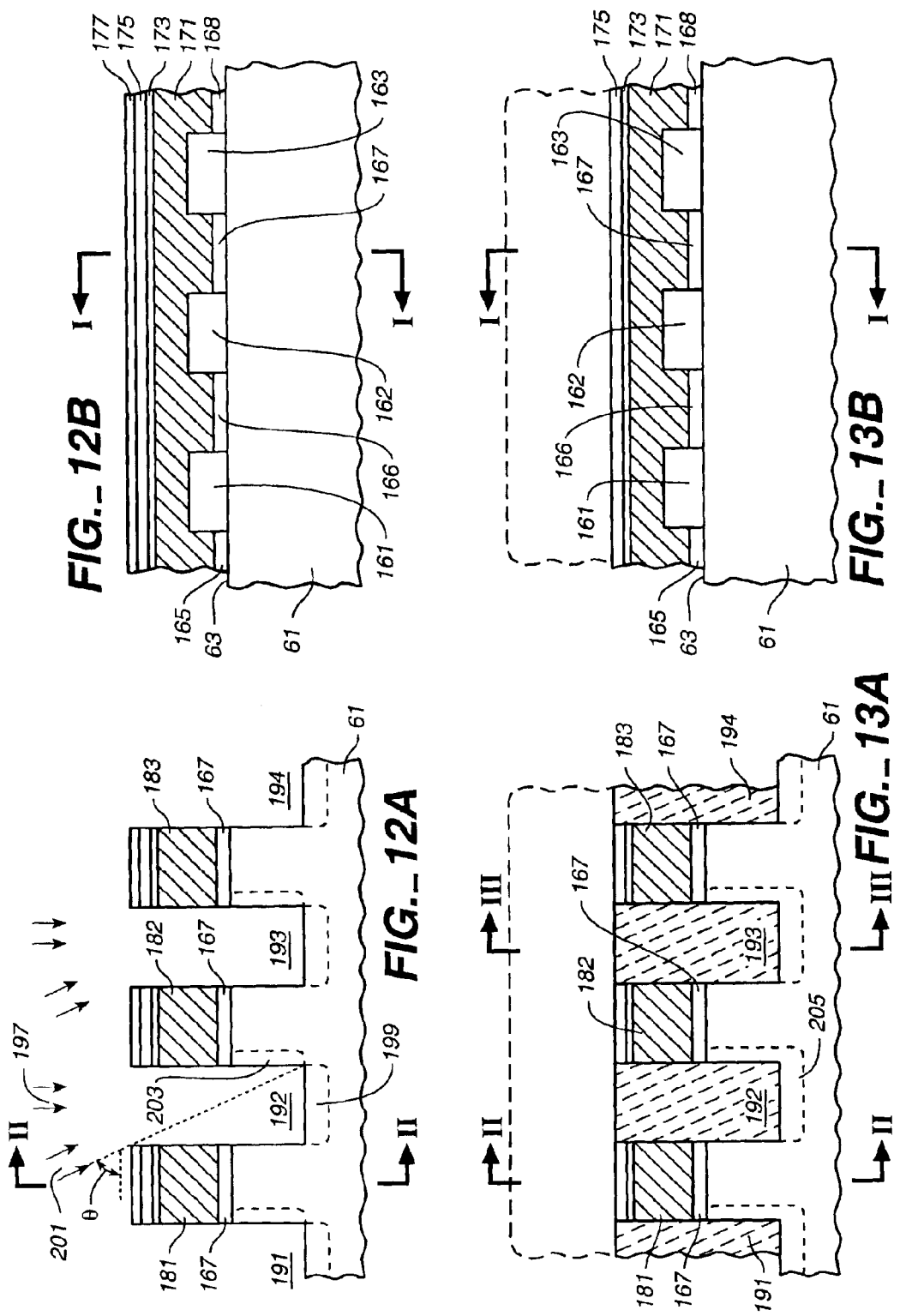

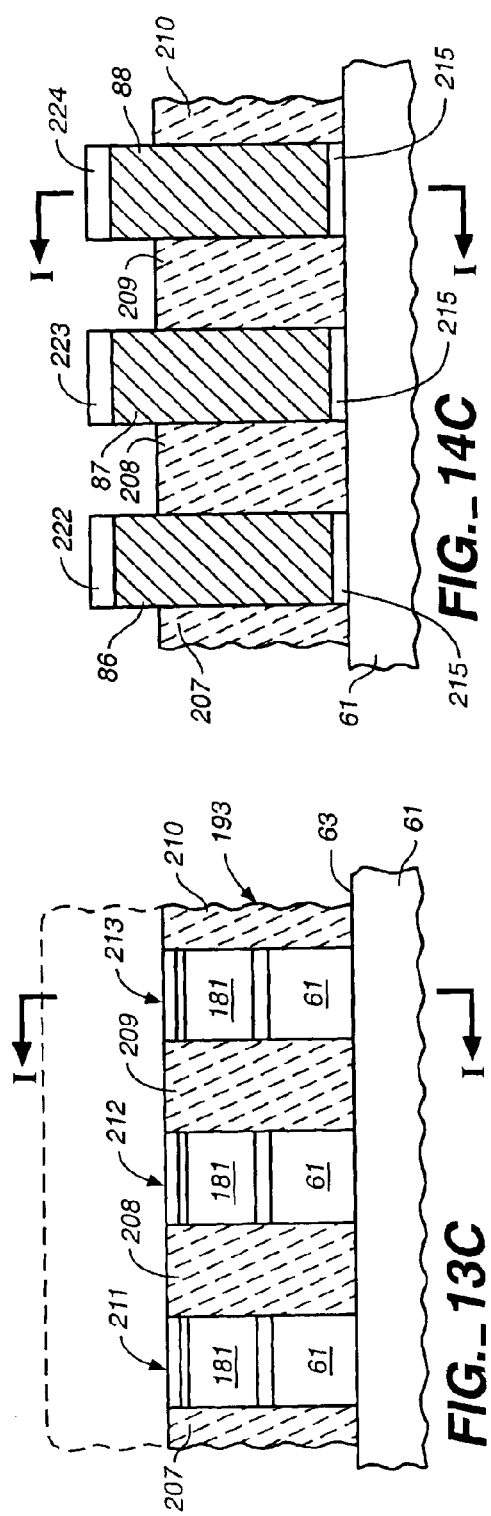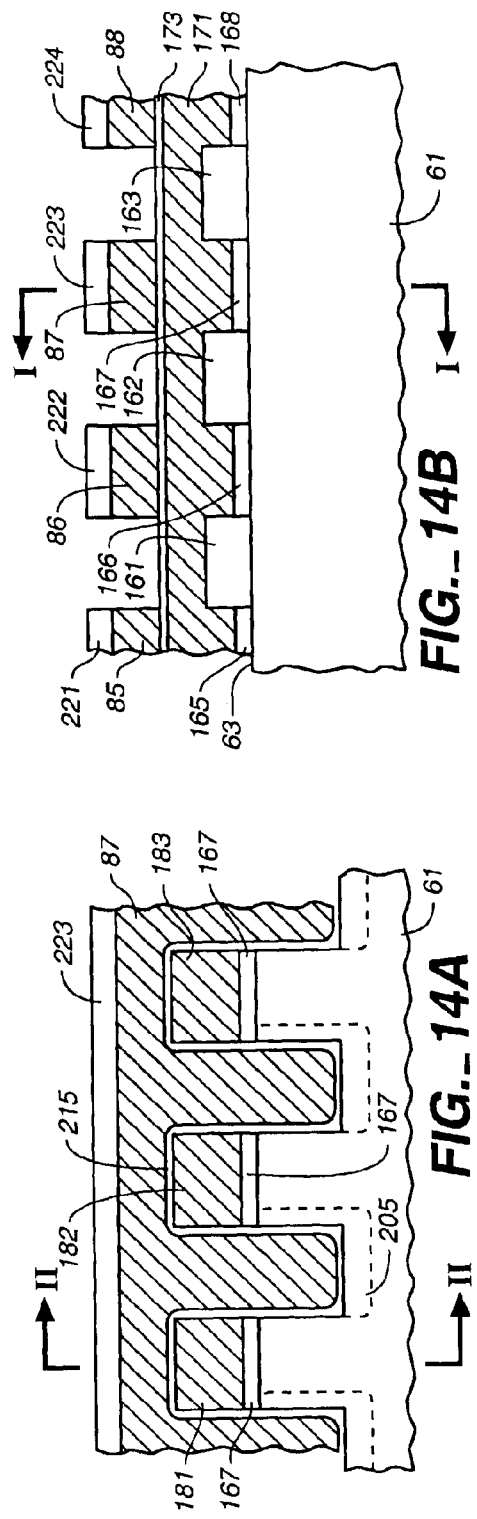

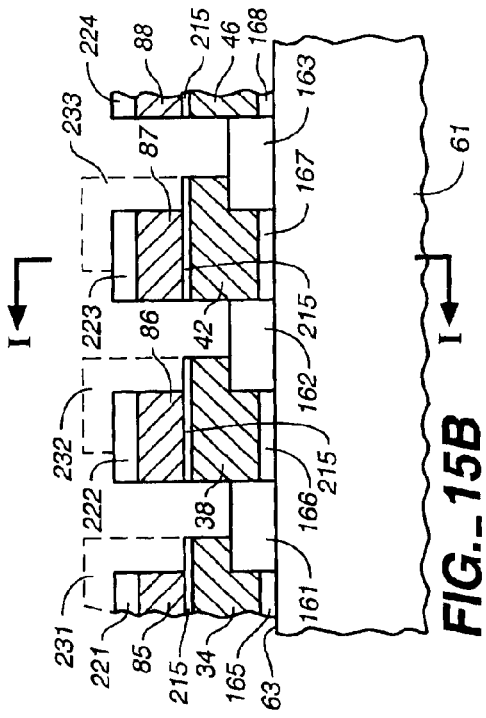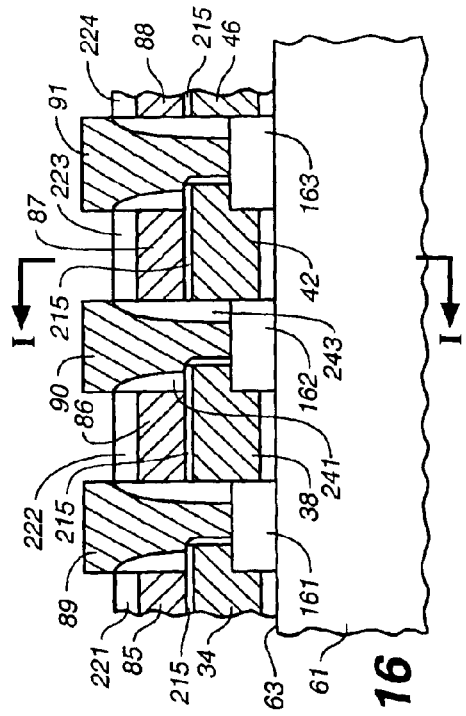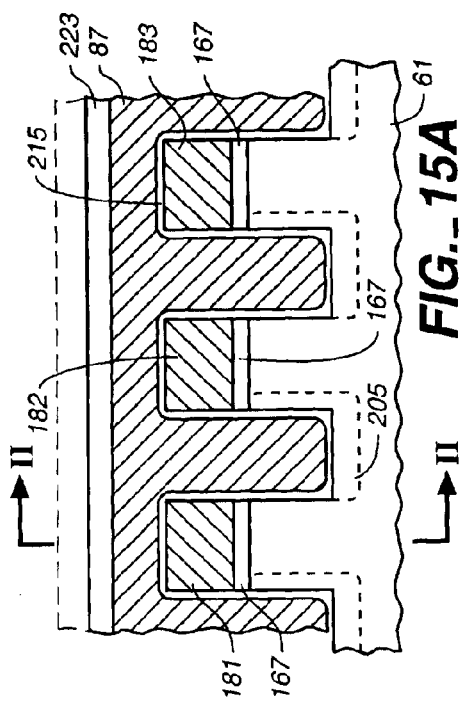

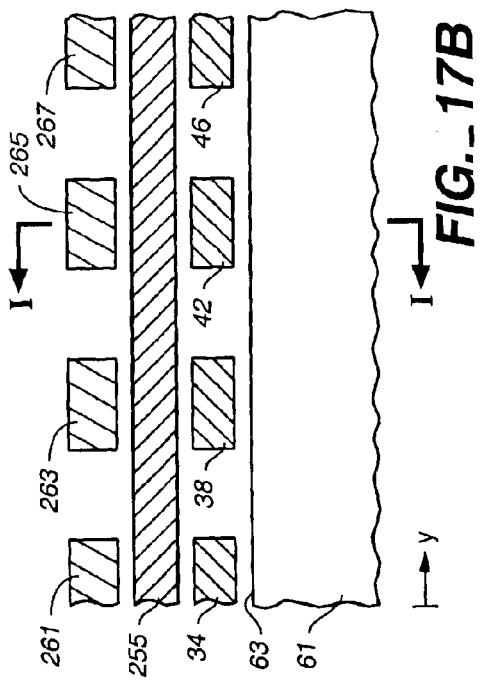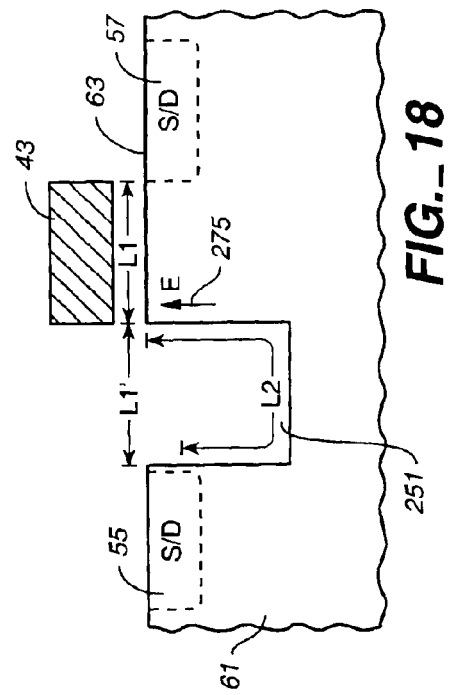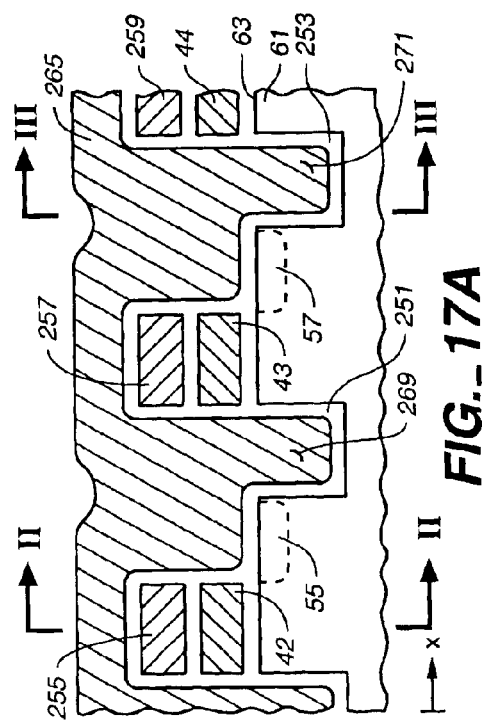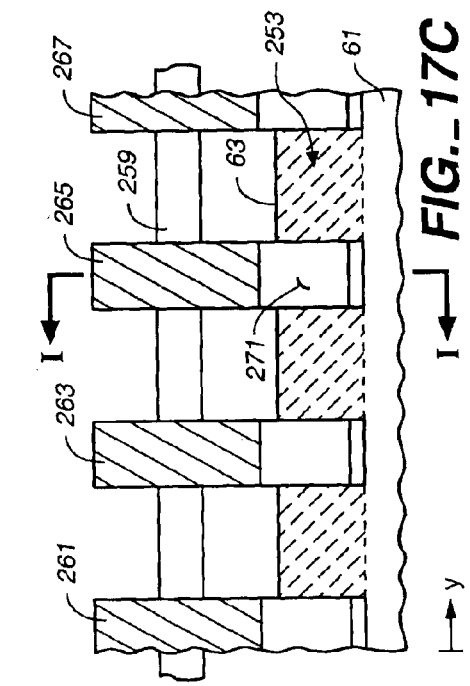
FIG._17A
FIG._17B
FIG._17C
FIG._18

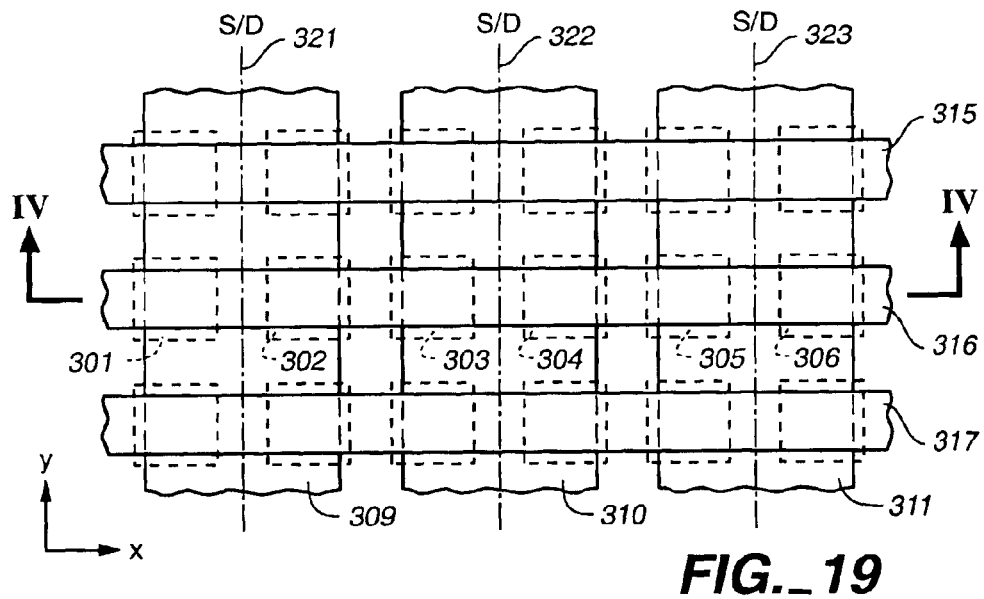
FIG._19
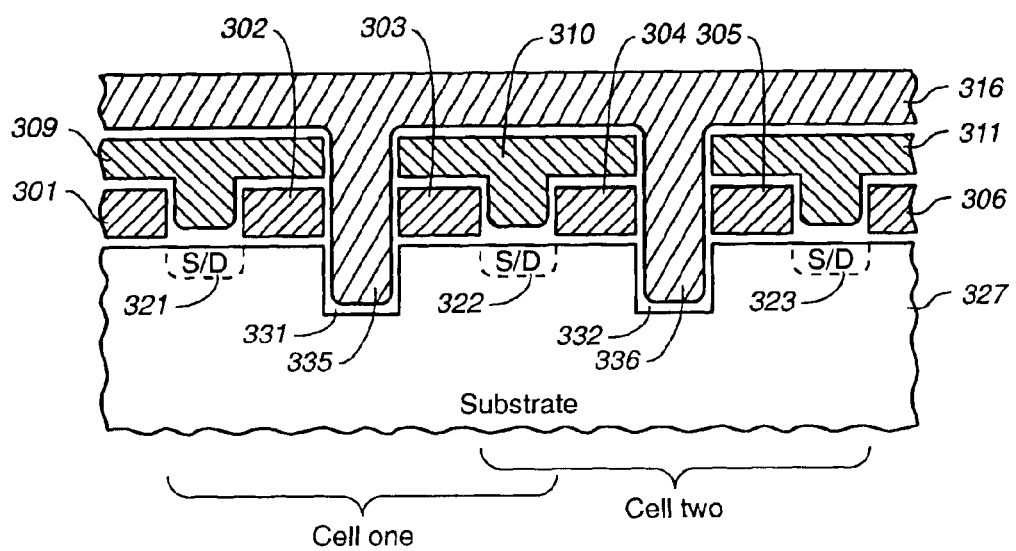
FIG._20

US 6,936,887 B2

NON-VOLATILE MEMORY CELLS UTILIZING SUBSTRATE TRENCHES

CROSS-REFERENCE TO RELATED APPLICATION

This is a continuation-in-part of application Ser. No. 09/860,704, filed May 18, 2001.

FIELD OF THE INVENTION

This invention relates to non-volatile flash EEPROM (Electrically Erasable and Programmable Read Only Memory) cell arrays, primarily to the structure of memory cells and to processes of manufacturing memory cell arrays.

BACKGROUND

There are many commercially successful non-volatile memory products being used today, particularly in the form of small cards, which use a flash EEPROM array of cells having a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) giving the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in copending U.S. patent application Ser. No. 09/239,073, filed Jan. 27, 1999, now U.S. Pat. No. 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function 2. Further, such cells may operate with source side programming, having an advantage of lower programming current and voltage. The use of steering gates in a flash EEPROM array is described in U.S. Pat. Nos. 5,313,421, 5,712,180, and 6,222,762, which patents are incorporated herein by this reference.

Two techniques of removing charge from floating gates to erase memory cells are used in both of the two types of memory cell arrays described above. One is to erase to the substrate by applying appropriate voltages to the source, drain, substrate and other gate(s) that cause electrons to tunnel through a portion of a dielectric layer between the floating gate and the substrate.

The other erase technique transfers electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making compromises to accommodate the two functions.

It is continuously desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, a cell with sixteen states stores four bits of data, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or of the overall array. Shrinking the size of integrated circuits is commonly performed for all types of circuits as processing techniques improve over time to permit implementing smaller feature sizes. But since there are limits of how far a given circuit layout can be shrunk by scaling through simple demagnification, efforts are so directed toward redesigning cells so that one or more features takes up less area.

In addition, different designs of memory cells have been implemented in order to further increase data storage density. An example is a dual floating gate memory cell, which can also be operated with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. An example of this cell array architecture, processing and operating techniques are described in U.S. Pat. No. 5,712,180, which is incorporated herein by this reference (hereinafter referred to as the "Dual Storage Element Cell").

SUMMARY OF THE INVENTION

The present invention is directed to the use of substrate trenches in arrays of these and other types of non-volatile memory cells in order to reduce their size and/or improve their performance. In general, vertical surfaces of the trenches are used as part of the cells. More specifically, the select transistor gates are caused to protrude into substrate trenches in a manner forming at least part of the select transistor channel length along one or both of the trench sidewalls. According to a first aspect of the present invention, a source or drain diffusion is also included in the trench, having a primary advantage of reducing the size of the individual memory cells in at least one dimension. According to a second aspect of the present invention, both of the sidewalls and the bottom of the trench serve as the select transistor channel, having a primary advantage of increasing the length of its channel without increasing the cell size. In both cases, the cell charge storage elements are oriented horizontally, preferably above a top surface of the substrate, with at least one edge of individual storage elements being positioned immediately adjacent to, or extending slightly over, a sidewall of one such trench. This also has an advantage of improving programming efficiency, particularly with source side injection. The memory cells are optionally but preferably provided with a third gate element that serves either as an erase gate or a steering gate, depending upon how it is oriented and used.

In one specific form of the invention, individual charge storage elements in the form of floating gates span the entire distance between adjacent trenches over a top surface of the substrate, the select transistor channel being on one sidewall of the trenches that face the same direction, and the source/drain diffusions being formed in the bottom of the trench and extending up along a sidewall opposite to that of the select transistor channel. The size of the individual memory cells, and thus of the array, is reduced in one direction while maintaining a similar orientation of the select and floating gate storage transistors of the individual memory cells. Further, the resulting source and drain diffusions have larger cross-sectional areas than usual, thus increasing their conductivity and, as a result, reducing the number of electrical contacts that are necessary along the length of the diffusions.

In another specific form of the invention, memory cells having two charge storage elements constructed with the select transistor formed between the two charge storage transistors and with its gate extending into the substrate trench. Use of the trench increases the length of the select transistor channel without increasing the surface area of the memory cell. This increased channel length reduces leakage current through the select transistor, preventing "punch-through". This structure also allows future scaling downward of the size of the individual memory cells while maintaining some degree of independent control over the absolute length of the select transistor channel length.

Further examples of Dual Storage Element Cell arrays, in which the recessed select transistor gate element of the present invention may be implemented, are given in U.S. Pat. Nos. 6,103,573 and 6,151,248, and in pending applications Ser. Nos. 09/667,344, filed Sep. 22, 2000, now U.S. Pat. Nos. 6,512,263, and 09/925,102, filed concurrently with the present application by Yuan et al., entitled "Scalable Self-Aligned Dual Floating Gate Memory Cell Array and Method of Forming the Array," which patents and patent applications are incorporated herein in their entirety by this reference.

Additional objects, advantages and features of the various aspects of the present invention are included in the following description of its preferred embodiments, which description should be read in conjunction with the accompanying drawings.

BRIEF DESCRIPTION OF THE DRAWINGS

FIGS. 1 and 2 are cross-sectional views along rows of two types of split-channel cells according to the prior art;

FIG. 3 is a generic plan view of an array of floating gate memory cells in which the improvements of the present invention are explained;

FIGS. 4A and 4B are cross-sectional views of memory cells according to a first specific embodiment of the present invention, taken at sections I—I and II—II, respectively, across the array of FIG. 3;

FIGS. 5A and 5B are cross-sectional views of memory cells according to a second specific embodiment of the present invention, taken at sections I—I and II—II, respectively, across the array of FIG. 3;

FIGS. 6A and 6B are cross-sectional views of memory cells according to a third specific embodiment of the present invention, taken at sections I—I and II—II, respectively, across the array of FIG. 3;

FIGS. 7A and 7B are cross-sectional views of memory cells according to a fourth specific embodiment of the present invention, taken at sections I—I and II—II, respectively, across the array of FIG. 3;

FIG. 8 is a block diagram of a flash EEPROM system that utilizes the memory cells of either of the second or fourth specific embodiments of respective FIGS. 5A, 5B and 7A, 7B;

FIG. 9 is a block diagram of a flash EEPROM system that utilizes the memory cells of either of the first or third specific embodiments of respective FIGS. 4A, 4B and 6A, 6B;

FIGS. 10A and 10B show in cross-section an intermediate structure which occurs during the formation of the third cell array embodiment of FIGS. 6A and 6B, taken at sections I—I and II—II, respectively, of FIG. 3;

FIGS. 11A and 11B show in cross-section another intermediate structure which occurs during the formation of the third cell array embodiment of FIGS. 6A and 6B, taken at sections I—I and II—II, respectively, of FIG. 3;

FIGS. 12A and 12B show in cross-section another intermediate structure which occurs during the formation of the third cell array embodiment of FIGS. 6A and 6B, taken at sections I—I and II—II, respectively, of FIG. 3;

FIGS. 13A, 13B and 13C show in cross-section another intermediate structure which occurs during the formation of the third cell array embodiment of FIGS. 6A and 6B, taken at sections I—I, II—II and III—III, respectively, of FIG. 3;

FIGS. 14A, 14B and 14C show in cross-section another intermediate structure which occurs during the formation of the third cell array embodiment of FIGS. 6A and 6B, taken at sections I—I, II—II and III—III, respectively, of FIG. 3;

FIGS. 15A and 15B show in cross-section another intermediate structure which occurs during the formation of the third cell array embodiment of FIGS. 6A and 6B, taken at sections I—I and II—II, respectively, of FIG. 3;

FIG. 16 shows in cross-section a subsequent structure occurring during the formation of the third cell array embodiment of FIGS. 6A and 6B, taken at section II—II of FIG. 3;

FIGS. 17A, 17B and 17C are cross-sectional views of memory cells according to a fifth specific embodiment of the present invention, taken at sections I—I, II—II and III—III, respectively, across the array of FIG. 3;

FIG. 18 schematically illustrates the structure and operation of the fifth embodiment;

FIG. 19 is a plan view of a memory cell array according to a sixth specific embodiment of the present invention; and FIG. 20 is a cross-sectional view of the memory cell array of FIG. 19, taken at IV—IV thereof.

DESCRIPTION OF EXEMPLARY EMBODIMENTS

A typical split channel prior art memory cell and array are illustrated by the sectional view of FIG. 1, wherein a semiconductor substrate 11 has a two dimensional array of rows and columns of floating gates distributed across its surface. Floating gates 13, 15 and 17, adjacent to each other along a row, are shown. Spaces 14 and 16 exist between floating gates. Elongated source and drain diffusions 19, 21 and 23 extend parallel with each other across the substrate in a direction into the paper. A conductive word line 25 extends along and over a row of floating gates. Some memories erase the floating gates to the substrate but others include a third gate (not shown) between rows of floating gates that is capacitively coupled with at least one of the rows for erasing the floating gates by electron tunneling through a dielectric between them. Dielectric layers between the gates, and between the gates and the substrate are not shown in order to reduce the clutter of the drawings but are understood to exist.

The channel of this type of memory cell is split into two segments. One segment L1 is controlled by the voltage of the floating gate 15, which in turn is influenced by the voltage on its word line 25, and another segment L2 is controlled by the voltage of the word line 25 alone. This cell is, in effect, formed of two series connected transistors, the floating gate transistor (L1) and the select transistor (L2). The voltage on the word line 25 affects whether the select transistor of each of the cells through which it passes is turned on or off, and thus whether the floating gate transistors of these cells are connected between the cell's adjacent source and drain diffusions, such as the diffusions 19 and 21 of the cell that is illustrated.

A variation of the cell and array of FIG. 1 is shown in FIG. 2. Steering gates 27, 29 and 31, elongated in a direction into the paper, are added. The steering gates extend along columns of floating gates and are capacitively coupled with them. They separate the word lines from being coupled with the floating gates over which they pass. A voltage on the word lines still controls the select transistors of the cells within their rows by being coupled with the L2 segment of the cells' channels but is no longer used to control the voltage of the floating gates. The steering gates of this type of array do so. Voltages on the steering gates select the floating gates for programming or reading. Programming by source side injection is then possible, which method can use reduced currents and/or voltages during programming. Erasing of the floating gates can be either to the substrate or to the word line.

FIG. 3 shows a few elements of an array of floating gate memory cells in plan view across a surface 63 of a semiconductor substrate 61, as a framework in which to reference many of the cross-sectional views that follow. Floating gates 33–48 are arranged in an array of rows (extending in the "x" direction indicated) and columns (extending in the "y" direction indicated) that are perpendicular with each other. The floating gates are rectangular in shape, often square, and are spaced apart from each other in each of the x and y directions. Source and drain diffusions 51, 53, 55, 57 and 59 are elongated in the y direction and spaced apart from each other in the x direction, and are positioned between columns of floating gates. This general outline of memory elements is common to each of the four different structures described in FIGS. 4A–7B.

First Specific Embodiment of the Memory Cells and Array

In the embodiment shown by the orthogonal cross-sectional views of FIGS. 4A and 4B, alternate diffusions are positioned across the substrate in the x-direction in the bottom of trenches in the substrate, and the remaining diffusions are formed on the substrate surface. The trenches are elongated in the y-direction and spaced apart in the x-direction. The diffusions 53 and 57, for example, are in the bottom of respective trenches 64 and 66 in the substrate 61, while the diffusion 55 is formed in the substrate surface 63. Word lines 67–70 are elongated with their lengths extending in the x-direction across the substrate over a row of floating gates, while being spaced apart in the y-direction. The word lines include select gates extending down into the trenches, as shown in FIG. 4A for the word line 69 with select gates in the trenches 64 and 66. A thin dielectric between the walls of a trench and the select gate therein provides capacitive coupling between the select gate and the channel portions in both of the opposite trench walls. The voltage on the word line thus controls the conduction of the trench wall channel portions L2 along the row of cells. The floating gates are formed from a first deposited polysilicon layer, and the word lines from another polysilicon layer that is subsequently deposited.

Each sidewall of the individual trenches is a channel of a select transistor. For the memory cell including the floating gate 43, for example, the L2 portion of the channel is along one sidewall of the trench 66 while the L1 portion of the channel is along the substrate surface 63. An adjacent memory cell including the floating gate 44 utilizes the opposite sidewall of the trench 66 for its select gate channel portion L2 while the channel portion L1 is along the substrate surface. Adjacent memory cells are thus mirror images of one another in the x-direction across the substrate. Since the select transistor channel portions L1 of the cells are formed vertically, the size of the array is reduced in the x-direction across the substrate 61. Yet the floating gates remain across the surface 63 of the substrate 61.

As a mechanism for erasing the floating gates, erase gates 71–73 are formed from a third polysilicon layer with their lengths extending in the x-direction. The erase gates are spaced apart in the y-direction and located between rows of floating gates. Each erase gate is preferably capacitively coupled through tunnel dielectric layers with the floating gates of a row on one side of the erase gate but not with the floating gates of the row on the other side. Alternatively, alternate erase gates in the x-direction across the substrate can be omitted and the remaining erase gates coupled with the rows of floating gates on both sides.

The need to form erase gates is eliminated in this first embodiment of FIGS. 4A and 4B by erasing the floating gates to the substrate 61 instead. This is accomplished by placing appropriate voltages on the source, drain, substrate and word lines of the cells to be erased that cause the voltage of their floating gates to be sufficiently lower than that of the substrate. Electrons then tunnel through the floating gate dielectric to the substrate.

Second Specific Embodiment of the Memory Cells and Array

The orthogonal cross-sectional views of FIGS. 5A and 5B show a second embodiment that has the same structure of floating gates, trenches and diffusions as the first embodiment but the gates formed from the second and third polysilicon layers are different. The second polysilicon layer is formed into steering gates 75–78 that are elongated in the y-direction and spaced apart across the substrate 61 in the x-direction. Each steering gate extends across a column of floating gates with which it is capacitively coupled, so that a portion of the voltage on a steering gate is coupled with the floating gates under it.

Word lines 79–82 are formed from the third polysilicon layer. As can be seen from FIG. 5A, select transistor gates extend downward from the word line 81 into the trenches 64 and 66. As with the first embodiment, the select gates are capacitively coupled with both sides of the trenches that are opposite to each other in the x-direction. The floating gates may be erased to the word lines through a relatively thick interpoly dielectric positioned therebetween. Alternatively, the floating gates of this embodiment may be erased to the substrate. If erased to the substrate, the dielectric between the floating gates and the substrate is made to be relatively thin, such as in the range of 100 Angstroms thick.

Use of the steering gates separates the functions of the control gates of the first embodiment to turn on select transistors and couple a desired voltage to floating gates at the same time. These voltages may then be individually optimized rather than a compromise voltage applied to the control gates. During programming and reading, the select gates of the second embodiment are controlled by a voltage on the word lines while an appropriate voltage is coupled to the floating gates from the steering gates. Another advantage is that lower voltages may be used to program the cells from their source side.

Third Specific Embodiment of the Memory Cells and Array

A cell array using a different trench structure than in the first and second embodiments is illustrated by the orthogonal sectional views of FIGS. 6A and 6B. In this third embodiment, trenches are provided between each column of floating gates. Trenches 103, 104 and 105 of FIG. 6A have widths that extend completely between, or almost completely between, adjacent columns of floating gates that include respective floating gates 41–44. Source and drain diffusions 53, 55 and 57 of this embodiment are formed in the bottom and up one side of respective trenches 103, 104 and 105, the sides all facing in the same direction. The select gate channel L2 of a cell is on a wall of each trench that is opposite to the wall containing the diffusion. The floating gates 41–44 remain on the substrate surface 63 and extend between trenches on either side of them in the x-direction. The sidewall portion of the diffusions extend up to the substrate surface 63 and are individually overlapped on the surface 63 by a floating gate. The source and drain diffusions have an enlarged cross-sectional area that improves their conductivity and thus reduces the number of contacts which may be made along their lengths in the y-direction.

Select gates extending into the trenches are part of the individual word lines 85–88. As can best be seen from FIG. 6A, the word line 87 has select gates extending into each of the trenches 103, 104 and 105. They are capacitively coupled with the one wall of each trench that forms the L2 select transistor channel portion in order to select whether current will flow through their cells' substrate channels or not. In a manner similar to the first embodiment, erase gates 89–91 may be provided between rows and capacitively coupled with the floating gates of at least one of the adjacent rows for erasure but are omitted if the floating gates are erased to the substrate 61.

Fourth Specific Embodiment of the Memory Cells and Array

In the fourth embodiment illustrated by the orthogonally oriented cross-sectional views of FIGS. 7A and 7B, the trench structure, floating gate positions and the source and drain diffusion placement are the same as in the third embodiment described above. Added to this embodiment are steering gates 93–96, elongated in the y-direction and spaced apart in the x-direction, extending over individual columns of floating gates and capacitively coupled therewith, similar to the second embodiment described above. The advantages of using steering gates have already been discussed. Word lines 99–102, elongated in the x-direction and spaced apart in the y-direction, include select gates extending downward into the trenches and capacitively coupled with the trench wall opposite to the wall containing the diffusion, such as those of the word line 101 shown in FIG. 7A. As with the second embodiment, the floating gates are preferably erased to the word lines but they may also be erased to the substrate.

It will be noted from FIGS. 4A and 5A, that immediately adjacent cells of the first and second embodiments, when viewed in cross-section in the x-direction, are mirrored images of each another. Adjacent cells of the third and fourth embodiments, on the other hand, are not mirrored in the x-direction, as can be observed from FIGS. 6A and 7A. None of the four embodiments are mirrored in the y-direction.

Memory Systems Utilizing the Forgoing Embodiments of the Memory Cells and Arrays An example memory system incorporating the second and fourth embodiments of FIGS. 5A, 5B and 7A, 7B is generally illustrated in the block diagram of FIG. 8. These are the embodiments that utilize steering gates extending along columns of floating gates. A large number of individually addressable memory cells according to the second and fourth specific embodiments are arranged in a regular array 111 of rows and columns, although other physical arrangements of cells are certainly possible. Bit lines, designated herein to extend along columns of the array 111 of cells, are electrically connected with a bit line decoder and driver circuit 113 through lines 115. Word lines, which are designated in this description to extend along rows of the array 111 of cells, are electrically connected through lines 117 to a Word line decoder and driver circuit 119. Steering gates, which extend along columns of memory cells in the array 111, are electrically connected to a steering gate decoder and driver circuit 121 through lines 123. The steering gates and/or bit lines may be connected to their respective decoders by techniques described in a co-pending patent application by Harari et at. entitled "Steering Gate and Bit Line Segmentation in Non-Volatile Memories," Ser. No. 09/871,333, filed May 31, 2001, now U.S. Pat. No. 6,532,172, which application is incorporated herein in its entirety by this reference. Each of the decoders 113, 119 and 121 receives memory cell addresses over a bus 125 from a memory controller 127. The decoder and driving circuits are also connected to the controller 127 over respective control and status signal lines 129, 131 and 133. Voltages applied to the steering gates and bit lines are coordinated through a bus 122 that interconnect the decoder and driver circuits 113 and 121.

The controller 127 is connectable through lines 135 to a host device (not shown). The host may be a personal computer, notebook computer, digital camera, audio player, various other hand held electronic devices, and the like. The memory system of FIG. 8 will commonly be implemented in a card according to one of several existing physical and electrical standards, such as one from the PCMCIA, the CompactFlash™ Association, the MMC™ Association, and others. When in a card format, the lines 135 terminate in a connector on the card that interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 8 are permanently embedded in the host device.

The decoder and driver circuits 113, 119 and 121 generate appropriate voltages in their respective lines of the array 111, as addressed over the bus 125, according to control signals in respective control and status lines 129, 131 and 133, to execute programming, reading and erasing functions. Any status signals, including voltage levels and other array parameters, are provided by the array 111 to the controller 127 over the same control and status lines 129, 131 and 133. A plurality of sense amplifiers 137 receive current or voltage levels from the circuit 113 over lines 139 that are indicative of the states of addressed memory cells within the array 111, and provides the controller 127 with information about those states over lines 141 during a read operation. A large number of sense amplifiers 137 are usually used in order to be able to read the states of a large number of memory cells in parallel. During reading and program operations, one row of cells is typically addressed at a time through the circuits 119 for accessing a number of cells in the addressed row that are selected by the circuits 113 and 121. During an erase operation, all cells in each of many rows are typically addressed together as a block for simultaneous erasure.

A similar memory system is illustrated in FIG. 9, but for an array of memory cells that have separate erase gates without the use of steering gates. Examples of such arrays are the first and third embodiments described above with respect to FIGS. 4A, 4B and 6A, 6B. Instead of the steering gate decoder and driver circuit 121 of FIG. 8, an erase gate decoder and driver circuit 143 is included. Proper erase voltages are applied through lines 145 to the erase gates of the cells that are selected for simultaneous erase. Voltages applied to the erase gates and bit lines are coordinated through a bus 147 that interconnects the decoder and driver circuits 113 and 143.

Operation of memory systems such as those illustrated in FIGS. 8 and 9 are described in patents identified in the Background section above, and in other patents assigned to SanDisk Corporation, assignee of the present application. In addition, U.S. patent application Ser. No. 09/793,370, filed Feb. 26, 2001, publication no. 2002/00118574, describes a data programming method, which application is incorporated herein by this reference.

Any one of the four cell and array embodiments described above can be modified to erase its floating gates to the substrate rather than to either erase gates (embodiments of FIGS. 4A, 4B and 6A, 6B) or word lines (embodiments of FIGS. 5A, 5B and 7A, 7B). In these cases, appropriate voltages are applied to the substrate and to the sources, drains and steering gates of the memory cells that are being simultaneously erased. In the case of the embodiments of FIGS. 4A, 4B and 6A, 6B, the erase gates are eliminated, thus leaving cells with two polysilicon layers formed into gates rather than three such layers.

Processes of Making the Forgoing Embodiments of the Memory Cells and Arrays

The cross-sectional views of FIGS. 10–16 illustrate a sequence of steps in a process of forming the third embodiment of the memory cell array described above with respect to FIGS. 6A and 6B. However, many of the steps in this specifically described process are also included in the processes of forming the first, second and fourth embodiments described above, as is apparent from the following description.

FIGS. 10A and 10B show the results of several initial processing steps. Strips 161–163 of field oxide are formed by depositing a layer of oxide about 2000 Angstroms thick across the surface 63 of the substrate 61. A photoresist mask is then used to etch this layer into the strips 161–163, which have lengths extending across the substrate in the x-direction and are spaced apart in the y-direction. Gate oxide layers 165-168 having a thickness of about 150 Angstrom are then grown on the substrate surface 63 between the field oxide strips 161–163. A next step is to deposit a first layer 171 of polysilicon about 2000 Angstroms thick over the field and gate oxide. The floating gates of the array are later formed from this polysilicon layer. Since the underlying surface on which the polysilicon layer is deposited is irregular, the polysilicon is deposited to a depth greater than desired for the floating gates in order to obtain a relatively smooth surface. That surface is then oxidized to a depth of the excess polysilicon material desired to be removed, thereby leaving the polysilicon layer 171 with the desired thickness and relatively planar top surface.

A next step after the polysilicon planarization is to grow an oxide layer 173 of about 200 Angstroms thick across the top of the polysilicon layer 171. This is followed by depositing a nitride layer 175 of about 1500 Angstroms on the oxide layer 173. Next, a layer 177 of oxide is deposited to a thickness of about 500 Angstroms across the nitride. The result is a three-layer dielectric is known as an "ONO" structure. The nitride layer is later used as a stop to end chemical-mechanical-planarization ("CMP") of the surface.

A next step is to deposit over the ONO structure a sacrificial layer of polysilicon having a thickness to be removed in a later step when trenches are etched into the substrate surface 63. As shown in FIGS. 11A and 11B, the two polysilicon layers, intervening ONO dielectric and field oxide strips are etched down to the substrate surface through a mask (not shown) in order to form strips 181–183 of the first polysilicon layer 171 and clean the substrate between those strips. The strips 181–183 have lengths extending in the y-direction across the substrate surface 63 and are spaced apart in the x-direction. The top polysilicon layer is similarly separated into strips 185–187.

The resulting structure shown in FIGS. 11A and 11B is then used as a mask to etch trenches 191–194 in the silicon substrate 61, as shown in FIGS. 12A and 12B. The top polysilicon layer (strips 185–187) is removed simultaneously with the substrate trenches 191–194 being formed, leaving the ONO dielectric structure in place, as shown in FIGS. 12A and 12B. The source and drain implants are next made, preferably in two steps. A first source position 197 directs ions in a path that is perpendicular with the substrate surface 63 to form doped regions in the bottom of the trenches, such as region 199 implanted in the bottom of the trench 192. The ONO and first polysilicon layer strips form an implant mask. A second source position 201 is directed at an angle θ with the substrate surface 63 to form doped regions along one side of each of the trenches, such as the region 203 along one sidewall of the trench 192. The angle θ is chosen to adequately expose the entire trench sidewall, from its bottom to the substrate surface 63. A resulting diffusion of the ions in a subsequent annealing step forms the ions into a continuous region 205 (FIG. 13A) extending from the substrate surface, down one trench sidewall to the trench bottom, and along the bottom of the trench to the opposite sidewall. The opposite sidewall is not implanted since it forms the select transistor portion of the memory cell substrate channel in the completed device.

A next step, as shown in FIGS. 13A, 13B and 13C, is to deposit a very thick layer of oxide, in the neighborhood of 5000 Angstroms, over the entire array. This completely fills in all the trenches and extends above the structure as indicated in dashed outline. The excess oxide is then removed by a CMP process, down to the nitride layer 175, which serves as a stop to the CMP process. A next step is to form a mask (not shown) of elongated strips with lengths extending across the planarized surface in the x-direction with spaces defining oxide in the trenches that is to be removed. The trench oxide is removed where the memory cells are to be formed, namely where the word lines and select gates are later positioned, while leaving the oxide in the trenches between the cells in the y-direction across the substrate. This remaining oxide provides dielectric isolation between rows of cells. This is best shown in FIG. 13C, where segments of oxide 207–210 are shown to alternate along the length of the trench 193 with open positions 211–213 where the oxide has been removed.

With reference to FIGS. 14A, 14B and 14C, a next step is to grow a 70–100 Angstrom layer 215 of oxide over the polysilicon strips 181–183 and the open surfaces of the substrate trenches 191–194. Another polysilicon layer is then deposited over the array to extend into the open regions of the trenches. A layer of about 1500 Angstroms of oxide is then deposited over the polysilicon. This combination is then patterned to remove strips of polysilicon and overlying oxide between rows of memory cells, leaving the elongated word lines 85–88 having lengths extending in the x-direction and being spaced apart in the y-direction across the substrate surface 63. Strips 221–224 of oxide then remain on the respective word lines 85–88.

The first polysilicon strips are then separated into individual floating gates, as illustrated by FIGS. 15A and 15B. To do so, a photoresist mask of strips 231–233 elongated in the x-direction is formed. These strips are positioned in the y-direction so each one extends over one edge of a respective word line in order to form a narrow mask opening between it and an opposite edge of an adjacent word line. The first polysilicon strips are then etched through those mask openings, to form, for example, the floating gates 34, 38, 42 and 46 from the polysilicon strip 171, as shown in FIG. 15B.

A next series of steps removes the photoresist mask and forms dielectric spacers along exposed polysilicon walls, as illustrated in FIG. 16. A thick layer of oxide is deposited over the structure shown in FIGS. 15A and 15B, after the photoresist mask strips 231–233 have been removed, and the oxide is removed by an anisotropic etch that leaves sidewall spacers along the vertical walls, such as spacers 241 and 243 of FIG. 16. This leaves edges of the floating gates exposed. A layer about 100 Angstroms thick is grown on these edges, a layer 245 of FIG. 16 being one of them. Another layer of polysilicon is then deposited over the array and patterned to leave the erase gates 89–91. The thin oxide layer 245 allows the floating gate 38 to be erased to the erase gate 90, while the spacers 241 and 243 separate the erase gate 90 from adjacent control gates 86 and 87, and from the floating gate 42, so as to not be capacitively coupled with any of them.

Certain of the foregoing processing details to make the cell array of the third embodiment of FIGS. 6A and 6B are modified to make the cell array of the fourth embodiment of FIGS. 7A and 7B. A primary difference is to form the steering gates 93–96 before the word lines 99–102 are formed, and the erase gates 89–91 are, of course, omitted.

Processes to make the first and second embodiments of FIGS. 4A–5B are different from processes to make the third and fourth embodiments of FIGS. 6A–7B primarily in that a trench is made in the substrate in only every other space between floating gates. Therefore, before the substrate etching step, a mask is formed that temporarily covers alternate spaces between strips of the first polysilicon layer. Further, the angled ion implantation 201 (FIG. 12A) is omitted since it is not desired to provide diffusions along the trench sidewalls in these embodiments.

Fifth Specific Embodiment of the Memory Cells and Array

The cell structure illustrated in FIGS. 17A, 17B and 17C uses a select gate trench but locates the source and drain diffusions outside of the trench, on the surface of the substrate. The trench increases the length of the select transistor channel as a result of the contribution of the sidewalls of the trench. This allows the cell to be proportionately shrunk in surface area as processing technology advances over time, while at the same time maintaining some degree of independent control over the select transistor channel length, to reduce the possibility of the select transistor punching through in the shrunk cell. The memory cell of FIGS. 17A, 17B and 17C avoids the necessity of forming ion implants for the source and drain regions in the trench, and avoids the need to locate the floating gate within the trench.

This example memory cell is now described, the cross-sectional views of FIGS. 17A, 17B and 17C being taken at sections I—I, II—II, and III—III, respectively, of the plan view of FIG. 3. Trenches in the substrate, such as trenches 251 and 253, are elongated in the y-direction and spaced apart in the x-direction. Doped polysilicon steering gates 255, 257 and 259, which are also elongated in the y-direction and spaced apart in the x-direction, are shown with a suitable interpoly dielectric between them and the respective underlying floating gates 42, 43 and 44. The use of the trenches being described also applies to an array of cells that does not use the steering gates. Doped polysilicon word lines 261, 263, 265 and 267, elongated in the x-direction and spaced apart in the y-direction, extend across individual rows of floating gates and intermediate steering gates, with a suitable interpoly dielectric layer therebetween.

Each word line also extends into the trenches of each of the memory cells in its row to form select transistor gates, such as gates 269 and 271 that are part of the word line 265. A suitable gate dielectric layer is provided between each such gate and the inside of the substrate trench in which it is positioned. A voltage on the word line places that voltage on all the select transistor gates along the word line. This voltage is coupled through the gate dielectric to the opposite portions the walls and bottom of the trench that operate as the channel of the select transistor. This voltage is chosen during operation of the memory system to either turn the cell select transistors of the word line on or off, depending whether the row of memory cells of the word line is being interrogated or not for either programming or reading. Such a memory array can operate to erase its cells to either the word lines by electrons tunneling through the dielectric between the floating gates 34, 38, 42 and 46 and the word lines, or to the substrate by tunneling electrons through the gate dielectric between the floating gates and the substrate. An array of memory cells according to FIGS. 17A, 17B and 17C can be employed in the system of FIG. 8. If steering gates are not used and erase gates are added, such an array is used in the system of FIG. 9.

The substrate trenches in which the select gates extend are preferably made to be continuous in the y-direction, with silicon oxide or some other suitable dielectric filling these trenches between the select transistor gates. This is shown in FIG. 17C for the trench 253, wherein the regions shown between select transistor gates to have dashed cross-hatching represent this oxide. Alternative to forming a continuous trench, recesses that are square in plan view are formed in the substrate to accept only the select gates and the intermediate gate dielectric.

FIG. 18 shows an enlarged view of a part of a memory cell, in order to better illustrate its operation. The L1 portion of the cell channel, between adjacent source and drain diffusions 55 and 57, lies along the surface 63 of the substrate 61 under the cell's floating gate 43, adjacent the diffusion 57, as before. The select transistor gate portion L2, however, extends from the L1 channel portion to the other diffusion 55 along the walls and bottom of the substrate trench 251. The gate positioned in the trench (not shown in FIG. 18) is field coupled through a gate dielectric layer with the substrate along the walls and bottom of the substrate for the length L1. This length is, of course, much longer than that of a direct path L1' that would be the case if the select transistor channel portion lies along the substrate surface, without use of the trench 251. The trenches, in a specific example, are made to have a depth of from about 500 to 3000 Angstroms, with a depth of around 2000 Angstroms being suitable for most implementations. The size L1' of the opening of each trench will generally be that of the minimum feature size of the processing used.

One advantage of using such a trench is an improved efficiency of programming. As indicated by an arrow 275, electrons will be accelerated upward along an interior sidewall of the trench 251 within the select transistor channel during programming by source side injection. These electrons travel in a path that directly intersects an edge of the floating gate 43 when that floating gate is positioned immediately alongside the trench 251, as is the case if that edge of the floating gate is used as part of the mask during etching of the trench 251. A higher injection efficiency of electrons into the floating gates is expected because these electrons are injected into the floating gate in the direction of their momentum. This advantage also applies to other embodiments described herein, when electrons are moved with high energy in a path along a trench sidewall that is directed to intersect with a floating gate.

One way of making the trenched structure shown in FIGS. 17A–C is to implant ions in the substrate for the source and drain regions, and then form strips of the first polysilicon layer without being self-aligned with the implants. Masking material is then placed in strips along edges of the polysilicon strips facing the same way in the x-direction but leaving spaces between these masking strips and the adjacent polysilicon strips. These spaces define the trenches, which are then etched into the substrate through the spaces. Alternatively, dielectric spacers can be formed along the edges of the polysilicon strips, and alternate spacers along the edges facing in one direction are removed. This leaves spaces between the remaining spacers and the adjacent polysilicon strip edges through which the trenches are etched. As apparent from FIGS. 17A–C, the memory cells of the array structure have a regular non-mirrored pattern in each of these cross-sectional views.

Sixth Specific Embodiment of the Memory Cells and Array

A variation of the embodiment of FIGS. 17A–18 places its select transistor gate trench between the two floating gates of the Dual Storage Element Cell described above in the Background, with reference to certain patents and patent applications incorporated herein. The use of a select transistor gate trench is shown herein for one specific form of such a cell that is illustrated in the documents incorporated by reference to describe the Dual Storage Element Cell. FIG. 19 shows a partial plan view of an array of such cells, and FIG. 20 a cross-sectional view of that array taken at section IV—IV (along the x-direction) thereof to show the location of the select transistor gate trench. Additional details of such dual storage element cells and methods of forming them may be had by reference to the incorporated patents and patent applications.

Referring to FIG. 19, a portion of a two-dimensional array of floating gates is shown in dashed outline. The section of FIG. 20, showing two memory cells, is taken in the x-direction through one row of floating gates 301–306. Steering gates 309, 310 and 311 are elongated in the y-direction and have a width in the x-direction extending over two adjacent columns of floating gates. Alternatively, each column of floating gates may have a separate steering gate. Word lines 315, 316 and 317 are elongated in the x-direction and positioned in the y-direction over individual rows of floating gates. Source and drain diffusions 321, 322 and 323 are formed in a surface of a semiconductor substrate 327, being elongated in the y-direction, with a length extending across a large number of rows, and spaced apart in the x-direction. Trenches 331 and 332 in the substrate 327 are elongated in the y-direction and spaced apart in the x-direction, into which select transistor gates are positioned, such as gates 335 and 336 that are part of the word line 316. The usual gate and interpoly dielectrics are formed in the spaces between the elements shown.

One memory cell includes source and drain (bit lines) diffusions 321 and 322, between which are two floating gates 302 and 303 that are positioned adjacent the diffusions. In between the two floating gates are the substrate trench 331 and the select transistor gate 335. Both of the sidewalls and the bottom of the trench 331 make up the length (L2) of the select transistor channel. The region of the substrate between the diffusion 321 and the trench 331 is the length (L1) of the channel of the left memory transistor including the floating gate 302. Similarly, the region of the substrate between the diffusion 322 and the trench 331 is the length (L1) of the channel of the right memory transistor including the floating gate 303. The trench 331 functions in the same manner as described with respect to FIGS. 17A–18, using the trench sidewalls to increase the length of the select transistor channel and improve programming efficiency. The other memory cells of the array are similarly constructed, including that between diffusions 322 and 323.

The substrate trenches are formed in alignment with the adjacent floating gates by etching the trenches with the same mask used to separate a first layer of polysilicon into the individual floating gates in the x-direction. In one form, this mask is formed by the steering gates with a protective material layer formed, such as oxide, on their top surfaces. Etching continues through the first polysilicon layer and into the substrate 327 with the same pattern, although the etchant used for substrate may be different than that used for the floating gate polysilicon layer. After etching the trench, a thin dielectric layer is formed on the exposed silicon substrate surfaces on the trench walls and bottom surface, as well as on exposed sides of the polysilicon floating and steering gates. This gate dielectric, shown in FIG. 20 to surround the select transistor gates 335 and 336, may be formed by growing and/or depositing silicon dioxide to a thickness of about 200 Angstroms on these surfaces. A third doped polysilicon layer is then preferably deposited over the structure to extend into the spaces between the floating and steering gates, after which this polysilicon layer is separated into the word lines shown. A thick dielectric, such as an oxide, is then deposited over the array to fill in the select transistor gate trenches between rows to isolate them.

In the memory cell configuration of FIGS. 19 and 20, as with that of FIGS. 17A–18, the source drain regions are formed in the surface of the substrate rather than on the bottom and/or a side of substrate grooves 331 and 332. This distinguishes the fifth and sixth embodiments from embodiments one through four described earlier. The select transistor channel may have ions implanted along the sides and the bottom of the trenches, however, in order to adjust the threshold of the select transistor channels, as is done when the select transistor channel is positioned along the surface of the substrate.

Alternate Storage Elements

The foregoing invention summary and specific examples of flash EEPROM memory cells have been described with respect to the type of cell that utilizes conductive floating gates as charge storage elements. However, many of the cell structures and processes described above also apply to memory cells that use a charge trapping dielectric as the storage element in place of a floating gate. For example, the floating gates of the embodiments of FIGS. 4A–4B, 5A–5B, 6A–6B, 7A–7B, 17A–C and 20 can be replaced by such a dielectric that is then sandwiched between the steering gates and the substrate. Although the dielectric can be separated into individual elements with the same sizes and positions as the floating gates, it is usually not necessary to do so since charge is trapped locally by such a dielectric. The charge trapping dielectric can extend over the entire array except in areas occupied by the select transistors. One specific configuration is for the dielectric to be formed in strips extending continuously in the y-direction across a large number of rows of cells but individually have a width that is contained between adjacent select transistors in the x-direction. Other regions of the dielectric may be removed in the course of separating the polysilicon layer(s) above the dielectric into its elongated strips without adverse effects but it is not necessary to do so. A portion of the dielectric within each cell that is sandwiched between a conductive gate and the substrate within the cell's channel is then a charge storage element for that cell.

Dielectric storage element memory cells are generally described in the following technical articles and patent, which articles and patent are incorporated herein in their entirety by this reference: Chan et al., "A True Single-Transistor Oxide-Nitride-Oxide EEPROM Device," *IEEE Electron Device Letters*, Vol. EDL-8, No. 3, March 1987, pp. 93–95; Nozaki et al., "A 1-Mb EEPROM with MONOS Memory Cell for Semiconductor Disk Application," *IEEE Journal of Solid State Circuits*, Vol. 26, No. 4, April 1991, pp. 497–501; Eitan et al., "NROM: A Novel Localized Trapping, 2-Bit Nonvolatile Memory Cell," *IEEE Electron Device Letters*, Vol. 21, No. 11, November 2000, pp. 543–545, and U.S. Pat. No. 5,851,881.

There are three specific charge trapping dielectric materials and configurations that can be utilized. One is a two-layer dielectric with oxide grown on the substrate and a layer of silicon nitride deposited thereover ("ON"). Another is a three-layer structure that adds another layer of silicon oxide, grown and/or deposited, over the silicon nitride layer ("ONO"). A third alternative is a single layer of silicon rich silicon dioxide sandwiched between the gate and the semiconductor substrate surface. This later material is described in the following two articles, which articles are incorporated herein in their entirety by this reference: DiMaria et al., "Electrically-alterable read-only-memory using Si-rich $SIO_2$ injectors and a floating polycrystalline silicon storage layer," *J. Appl. Phys.* 52(7), July 1981, pp. 4825–4842; Hori et al., "A MOSFET with Si-implanted Gate-$SiO_2$ Insulator for Nonvolatile Memory Applications," IEDM 92, April 1992, pp. 469–472.

Conclusion

Although the various aspects of the present invention have been described with respect to specific examples thereof, it will be understood that the invention is entitled to protection within the full scope of the appended claims.

It is claimed:

1. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by at least one storage element and a second channel segment that is controlled by a select gate portion of one of the word lines, an improved structure comprising:

trenches formed in the semiconductor substrate as part of the cells, said second channel portion of the individual cells being provided along at least a sidewall of one of the trenches and the select gate being positioned in the trench, elements of the source and drain diffusions and the first and second channel segments of adjacent cells being formed in a regular non-mirrored pattern in a direction across the array through these elements, and elongated third gates extending across the array along and capacitively coupled with the storage elements.

2. The memory structure of claim 1, wherein the elongated third gates are erase gates that have lengths extending in a direction along rows of storage elements and which are individually positioned between adjacent rows of storage elements in a manner to have capacitive coupling with edges of the storage elements of at least one of said adjacent rows.

3. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by at least one storage element and a second channel segment that is controlled by a select gate portion of one of the word lines, an improved structure comprising:

trenches formed in the semiconductor substrate as part of the cells, said second channel portion of the individual cells being provided along at least a sidewall of one of the trenches and the select gate being positioned in the trench, elements of the source and drain diffusions and the first and second channel segments of adjacent cells being formed in a regular non-mirrored pattern in a direction across the array through these elements, and elongated third gates extending across the array along and capacitively coupled with the storage elements, wherein the elongated third gates are steering gates that have lengths extending along columns of storage elements and are individually positioned to have capacitive coupling with top surfaces of the storage elements of at least one column and underlie said word lines.

4. The memory structure of either one of claims 2 and 3, wherein one of the trenches is positioned between each of adjacent columns of storage elements, and the source and drain diffusions are positioned at the bottom of the trenches and extend upwards along a sidewall of the trenches opposite to the second channel portion.

5. The memory structure of any one of claims 2 and 3, wherein the storage elements are charge trapping dielectric material.

6. The memory structure of any one of claims 1–3, wherein the storage elements are conductive floating gates.

7. The memory structure of any one of claims 1–3, wherein one of the trenches passes through the individual cells and said second channel portion of the individual cells is provided along two sidewalls and a bottom surface of the channel, said source and drain diffusions being formed in a surface of the substrate outside of the trenches.

8. The memory structure claim 7, wherein the individual cells include two storage elements positioned along a surface of the substrate on opposite sides of the trench.

9. The memory structure of claim 7, wherein the storage elements are conductive floating gates.

10. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by at least one storage element and a second channel segment that is controlled by a select gate portion of one of the word lines, an improved structure comprising:

trenches formed in the semiconductor substrate as part of the cells, said second channel portion of the individual cells being provided along at least a sidewall of one of the trenches and the select gate being positioned in the trench, elements of the source and drain diffusions and the first and second channel segments of adjacent cells being formed in a regular non-mirrored pattern in a direction across the array through these elements, and elongated third gates extending across the array along and capacitively coupled with the storage elements, wherein one of the trenches is positioned between each of adjacent columns of storage elements, and the source and drain diffusions are positioned at the bottom of the trenches and extend upwards along a sidewall of the trenches opposite to the second channel portion.

11. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by at least one storage element and a second channel segment that is controlled by a select gate portion of one of the word lines, an improved structure comprising:

trenches formed in the semiconductor substrate as part of the cells, said second channel portion of the individual cells being provided along at least a sidewall of one of the trenches and the select gate being positioned in the trench, elements of the source and drain diffusions and the first and second channel segments of adjacent cells being formed in a regular non-mirrored pattern in a direction across the array through these elements, elongated third gates extending across the array along and capacitively coupled with the storage elements, wherein one of the trenches passes through the individual cells and said second channel portion of the individual cells is provided along two sidewalls and a bottom surface of the channel, said source and drain diffusions being formed in a surface of the substrate outside of the trenches, and wherein the storage elements are charge trapping dielectric layers.

12. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by at least one storage element and a second channel segment that is controlled by a select gate portion of one of the word lines, an improved structure comprising:

trenches formed in the semiconductor substrate as part of the cells, said second channel portion of the individual cells being provided along at least a sidewall of one of the trenches and the select gate being positioned in the trench, elements of the source and drain diffusions and the first and second channel segments of adjacent cells being formed in a regular non-mirrored pattern in a direction across the array through these elements, elongated third gates extending across the array along and capacitively coupled with the storage elements, and wherein the storage elements are charge trapping dielectric layers.

13. An array of non-volatile memory cells on a semiconductor substrate, comprising:

elongated source and drain diffusions having their lengths extending in a first direction and being spaced apart in a second direction, the first and second directions being orthogonal to each other, an array of charge storage elements arranged in columns extending in the first direction and rows extending in the second direction, individual memory cells having one edge of their charge storage elements positioned along one of the diffusions, trenches in the substrate adjacent opposite edges of the charge storage elements in the second direction, said trenches containing another one of the diffusions, elongated control gates having lengths extending in the second direction along rows of floating gates and being capacitively coupled with the sidewalls of the trenches that are positioned immediately adjacent the charge storage elements, and elongated erase gates having lengths extending in the second direction across the array along and capacitively coupled with rows of charge storage elements.

14. The memory cell array of claim 13, wherein the source and drain diffusions are formed in the bottoms of the trenches and on a surface of the semiconductor substrate.

15. The memory cell array of claim 13, wherein the source and drain diffusions are formed in a bottom and one side of the trenches.

16. An array of non-volatile memory cells on a semiconductor substrate, comprising:

elongated source and drain diffusions having their lengths extending in a first direction and being spaced apart in a second direction, the first and second directions being orthogonal to each other, an array of charge storage elements arranged in columns extending in the first direction and rows extending in the second direction, individual memory cells having one edge of their charge storage elements positioned along one of the diffusions, trenches in the substrate adjacent opposite edges of the charge storage elements in the second direction, said trenches containing another one of the diffusions, elongated word lines having lengths extending in the second direction over rows of charge storage elements and having select gates capacitively coupled with the sidewalls of the trenches that are positioned immediately adjacent the charge storage elements, and elongated steering gates having lengths extending in the first direction across the array over and coupled with columns of charge storage elements.

17. The memory cell array of claim 16, wherein the source and drain diffusions are formed in the bottoms of the trenches and on a surface of the semiconductor substrate.

18. The memory cell array of claim 16, wherein the source and drain diffusions are formed in a bottom and one side of the trenches.

19. An array of non-volatile memory cells on a semiconductor substrate, comprising:

elongated trenches formed in the substrate with their lengths extending in a first direction and being spaced apart in a second direction, the first and second directions being orthogonal to each other, elongated source and drain diffusions with their lengths extending in the first direction and being spaced apart in the second direction such that first alternate diffusions are formed in the substrate along a bottom of individual trenches and that second alternate diffusions are formed in the substrate along a top surface thereof, an array of charge storage elements spaced apart across the top surface of the substrate in the first direction and individually spanning between a trench and substrate surface diffusion in the second direction without extending downward into a trench, elongated word lines having lengths extending in the second direction over charge storage elements and being spaced apart in the first direction, said word lines having select gates extending downward into the trenches to capacitively couple with opposing sidewalls of the trenches, and elongated third gates extending across the array and individually being capacitive coupled with a plurality of charge storage elements.

20. The memory cell array of claim 19, wherein the elongated third gates are erase gates having lengths extending in the second direction and which are spaced apart in the first direction, said third gates being coupled with adjacent charge storage elements.

21. The memory cell array of claim 19, wherein the elongated third gates are steering gates that have lengths extending in the first direction and which are spaced apart in the second direction, said third gates being coupled with the charge storage elements over which they pass.

22. An array of non-volatile memory cells on a semiconductor substrate, comprising:

elongated trenches formed in the substrate with their lengths extending in a first direction and being spaced apart in a second direction, the first and second directions being orthogonal to each other, elongated source and drain diffusions with their lengths extending in the first direction being formed in the substrate along a bottom and extending upward along one sidewall of the individual trenches to a top surface of the substrate but being absent from an opposite sidewall of the individual trenches, said one sidewall of the trenches facing the same direction, an array of charge storage elements spaced apart across the top surface of the substrate in the first direction and spanning between the trenches in the second direction without extending downward into the trenches, and elongated word lines having lengths extending in the second direction over the charge storage elements and being spaced apart in the first direction, said word lines having select gates extending downward into the trenches to capacitively couple with said opposite trench sidewalls.

23. The memory cell array of claim 22, which additionally comprises elongated steering gates having lengths extending in the first direction and being spaced apart in the second direction, said steering gates extending under the word lines and over the charge storage elements and being coupled therewith.

24. The memory cell array of claim 22, which additionally comprises elongated control gates having lengths extending in the second direction and being spaced apart in the first direction, said control gates being coupled with the charge storage elements along which the individual control gates are positioned.

25. An array of non-volatile memory cells that individually include at least one storage element transistor and at least one select transistor in series between source and drain regions of a substrate, comprising:

a recess in a surface of the substrate, said at least one storage element of the individual cells being positioned on the surface of the substrate with a first dielectric therebetween and adjacent one edge of the recess, a gate extending into the recess with a second dielectric therebetween in order to form a channel of the select transistor along opposing walls and a bottom surface of the recess, and components of the source and drain diffusions, recesses and storage elements being formed in a regular non-mirrored pattern in a direction across the array through the diffusions, recesses, gates and the storage elements.

26. The array of claim 25, wherein the storage elements are conductive floating gates.

27. An array of non-volatile memory cells that individually include at least one storage element transistor and at least one select transistor in series between source and drain regions of a substrate, comprising:

a recess in a surface of the substrate, said at least one storage element of the individual cells being positioned on the surface of the substrate with a first dielectric therebetween and adjacent one edge of the recess, a gate extending into the recess with a second dielectric therebetween in order to form a channel of the select transistor along opposing walls and a bottom surface of the recess, components of the source and drain diffusions, recesses and storage elements being formed in a regular non-mirrored pattern in a direction across the array through these components, and wherein the storage elements are charge trapping dielectric material.

28. An array of non-volatile memory cells, the memory cells individually comprising:

source and drain regions formed in a planar surface of a substrate a distance apart from each other, thereby defining a semi-conductive channel of the memory cell therebetween, first and second memory storage elements positioned over the planar substrate surface adjacent the respective source and drain regions, a recess formed in the substrate surface between the first and second storage elements in a manner to have sidewalls and a bottom, a select transistor gate extending into the recess in a manner to have field coupling with the recess sidewalls and bottom through a dielectric layer therebetween, thereby utilizing the recess sidewalls as part of the memory cell channel, and wherein the storage elements are charge trapping dielectric material.

29. The memory structure of any one of claims 13–24, wherein the charge storage elements are charge trapping dielectric layer material.

30. The memory structure of any one of claims 13–18, 20, 21, 23 and 24, wherein the storage elements are conductive floating gates.

* * * * *